United States Patent
Woo et al.

(10) Patent No.: US 6,440,289 B1
(45) Date of Patent: *Aug. 27, 2002

(54) METHOD FOR IMPROVING SEED LAYER ELECTROPLATING FOR SEMICONDUCTOR

(75) Inventors: Christy Mei-Chu Woo, Cupertino; Bhanwar Singh, Morgan Hill; Bharath Rangarajan, Santa Clara, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/285,334

(22) Filed: Apr. 2, 1999

(51) Int. Cl.[7] .................................................. C25D 7/12
(52) U.S. Cl. ........................ 205/103; 205/102; 205/104; 205/123; 205/157
(58) Field of Search ................................. 205/102, 103, 205/104, 123, 125, 184, 186, 187, 157

(56) References Cited

U.S. PATENT DOCUMENTS

| | | | |
|---|---|---|---|
| 4,514,265 A | 4/1985 | Rao et al. ...................... 204/15 |
| 4,869,971 A | 9/1989 | Nee et al. .................... 428/635 |
| 5,039,381 A | 8/1991 | Mullarkey .................. 204/58.5 |
| 5,256,274 A | * 10/1993 | Poris ........................... 205/123 |
| 5,326,454 A | 7/1994 | Engelhaupt .................... 205/67 |
| 5,723,028 A | 3/1998 | Poris ............................ 204/231 |
| 5,972,192 A | * 10/1999 | Dubin et al. ................. 205/101 |
| 6,074,544 A | * 6/2000 | Reid et al. ................... 205/157 |
| 6,140,241 A | * 10/2000 | Shue et al. .................. 438/692 |
| 6,197,181 B1 | * 3/2001 | Chen ............................ 205/123 |
| 6,203,684 B1 | * 3/2001 | Taylor et al. ................ 205/103 |

OTHER PUBLICATIONS

Frederick A. Lowenheim, Electroplating, 1978, p. 423.*
Yosi Shacham–Diamand & Sergery Lopatin, "High Aspect Ratio Quarter–Micron Electroless Copper Integrated Technology", *Microelectronic Engineering*, 37/38, 1997, pp. 77–78.
L.M. Weisenberger, "Copper Plating", *Metals Handbook Ninth Edition*, vol.5: Surface Cleaning, Finishing, and Coating, American Society for Metals, pp. 159–169.

* cited by examiner

*Primary Examiner*—Nam Nguyen
*Assistant Examiner*—William T. Leader
(74) *Attorney, Agent, or Firm*—Mikio Ishimaru

(57) ABSTRACT

A method is provided of forming a semiconductor seed layer starting with a non-electrochemical deposition of an initial deposition of the seed layer. This is followed by a very slow deposition rate electrochemical deposition with an organic additive at the beginning of the plating process to overcome the initial thin seed coverage at the bottom and bottom sidewall of a feature. The electrochemical deposition plates at a very low rate initially followed by a low rate deposition to build up a thicker and more uniform seed layer at the bottom and bottom sidewall. In the meantime, this slow plating rate step only adds a small thickness to the top portion of the feature where non-electrochemical deposition seed coverage was initially thicker.

9 Claims, 3 Drawing Sheets

METHOD FOR IMPROVING SEED LAYER ELECTROPLATING FOR SEMICONDUCTOR

CROSS-REFERENCE TO RELATED APPLICATION

The present application contains subject matter related to a concurrently filed U.S. Patent Application by Christy Mei-Chu Woo, Bhanwar Singh, and Bharath Rangarajan entitled "METHOD FOR IMPROVING SEED LAYER COVERAGE FOR SEMICONDUCTORS". The related application is assigned to the same assignee as the present application, is identified by Advance Micro Devices, Inc. patent docket number DA01092, U.S. Ser. No. 09/285,364, and is incorporated by reference.

TECHNICAL FIELD

The present invention relates generally to semiconductor seed layers and more specifically to forming seed layers by electroplating.

BACKGROUND ART

In the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of the conductive material into the oxide layer and the semiconductor devices. A seed layer is then deposited on the barrier layer to form a conductive material base, or "seed", for subsequent deposition of conductive material. Typically, the seed layer is used as one electrode for an electroplating process in which a conductive material is deposited over the barrier layer formed on the channel oxide layer and in the first channel openings. The conductive material is then subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin dielectric stop layer, or stop nitride layer, over the first channels and the first channel oxide layer. Subsequently, a via dielectric layer, or oxide layer, is deposited on the stop nitride layer followed by deposition of a thin via stop layer, or via nitride layer. A second channel dielectric layer, which is typically an oxide layer, is then deposited over the via nitride.

A via step photoresist is used in a photolithographic process to designate round via areas over the first channels, and etches are performed through the second channel oxide layer and via nitride layer to position the vias. The via step photoresist is then removed, or stripped. A second damascene step photoresist is placed over the second channel oxide layer and is photolithographically processed to form the pattern of the second channels. An anisotropic etch is then used to etch the second channel oxide layer to form the second channel openings and, during the same etching process to etch the via areas down to the thin stop nitride layer above the first channels to form the via openings. The second damascene step photoresist is then removed. A further nitride etch process removes the nitride above the first channels in the via areas. After the openings for the channels and vias are formed, a barrier layer is then deposited to coat the via openings and the second channel openings. Next, a seed layer is deposited on the barrier layer by a process such as chemical vapor deposition. This is followed by an electroplating of the conductive material on the seed layer in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

In place of etching the metalization materials, the damascene technique and electroplating are used for depositing the metalization materials. In order for electroplating to successfully fill the required channels and vias, it needs good copper seed coverage. As the devices get smaller and smaller, the aspect ratio (i.e., the ratio of depth to width) of channel and/or via in the damascene structure is getting higher. This high aspect ratio is putting a severe constraint on copper seed coverage inside the small and tall features. Seed coverage is also important to insure successful filling during electroplating, especially for copper and copper alloy metalization materials.

In channels and vias with minimal copper seed coverage, the thickness of the seed varies at different parts of these features. Typically, the thickest coverage from non-electrochemical deposition occurs at the re-entrant, or top opening, of a feature. If a moderate to high plating rate electrochemical deposition process is employed to fill such a feature, the thicker seed at the top of this feature will have a much faster deposition rate. The bottom and sidewall near bottom will have a much slower deposition rate. This disparity in deposition rate is a result of three factors. First, the electric field at the re-entrant and top of the structure is stronger and results in faster deposition. Second, the greater abundance of copper ion at the re-entrant results in faster buildup. Third, thinner or insufficient seed at the bottom and bottom sidewall will develop a higher electrical resistance whereas the thicker seed at the top of the feature has a much lower electrical resistance which will effect the deposition rate.

In order to fill a feature properly, it is necessary to carefully balance the deposition rate at five different locations on the feature. These locations are the top surface, the re-entrant, the top sidewall, the bottom sidewall, and the bottom. It has been almost impossible to consistently achieve the desired balance and high aspect ratios have been subject to problems with voids forming in the features. These voids result in higher resistance and open circuit failures.

As the semiconductor industry is moving from aluminum to copper and other type of materials with greater electrical conductivity and higher aspect ratio channels and vias, it is becoming more pressing that solutions be found.

DISCLOSURE OF THE INVENTION

The present invention provides a method for forming a seed layer starting with a non-electrochemical deposition of an initial deposition of the seed layer. This is followed by a very slow deposition rate electrochemical deposition at the beginning of the plating process to overcome the initial thin seed coverage at the bottom and bottom sidewall of a feature. The electrochemical deposition is accelerated to a slightly faster rate to build up a thicker and more uniform seed layer at the bottom and bottom sidewall while an organic additive in the plating bath is used to reduce plating at the re-entrant and top surface. When the bottom and bottom sidewall meet, a much higher plating rate is used.

The present invention further provides a method for using deposition current and an organic additive to balance the deposition of the seed on the five critical areas of a semiconductor feature.

The present invention further provides a thin copper seed deposited at a very low deposition rate of about 1 to 15 angstroms per sec. of direct current which is applicable to small geometry and to high aspect ratio features, e.g., trench or via for single or dual damascene techniques. After the deposition of a few hundred (100 to 300) angstroms of copper seed, the deposition rate is increased to a low 30 to 40 angstroms per second until the bottom sidewall and bottom close. To fill the feature, the deposition rate is increased to a high deposition rate of 60 to 100 angstroms per second.

The present invention further provides a thin copper seed deposited at about 1 to 15 angstroms per sec. of pulse wave current which is applicable to small geometry and to high aspect ratio features, e.g., trench or via for single or dual damascene techniques. After the deposition of a few hundred angstroms of copper seed, the deposition rate is increased to a low 30 to 40 angstroms per second until the bottom sidewall and bottom close. To fill the feature, the deposition rate is increased to a high deposition rate of 60 to 100 angstroms per second.

The present invention further provides a cost-effective seed deposition process as the copper seed deposition is very costly compared to electroplating.

The present invention further provides a process to enhance electroplating process margin by preventing the thin seed from closing off at the top of a feature.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
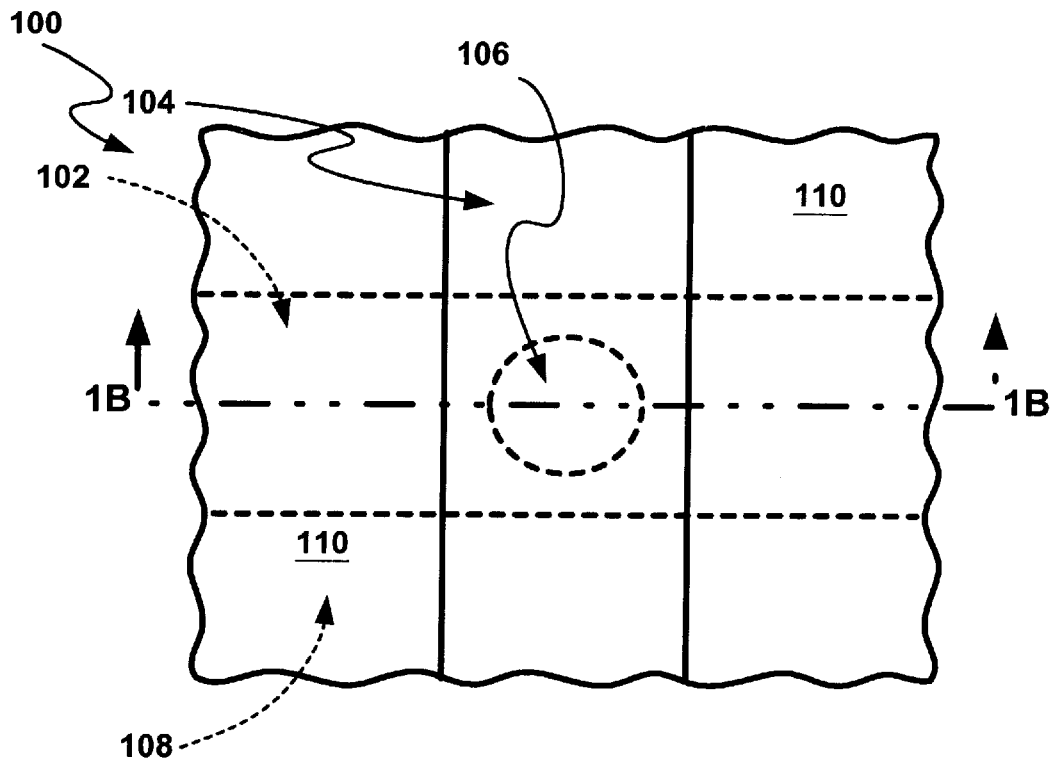
FIG. 1A (PRIOR ART) is a plan view of aligned channels and via.

Referring now to FIG. 1A (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 102 is shown disposed below a second channel 104 which extends substantially perpendicular to the first channel 102 in the plan view. A cylindrical via 106 connects the first and second channels 102 and 104, and is a part of the second channel 104. The first channel 102 is disposed in a first channel dielectric, or first channel oxide layer 108. The second channel 104 is disposed in a second channel dielectric, or second channel oxide layer 110.

Figure 1B:
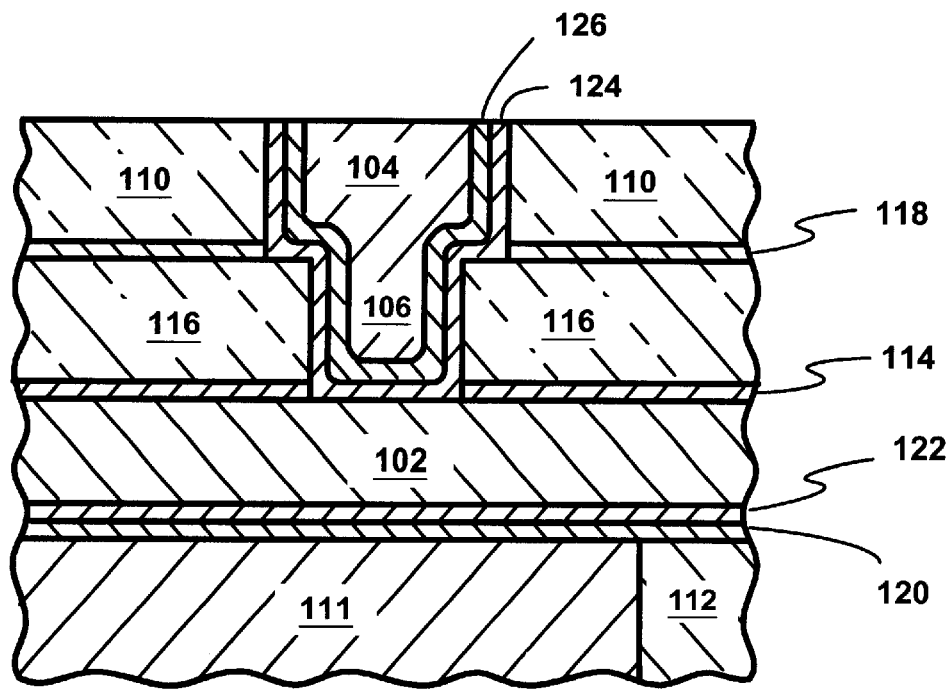
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 102 is disposed over a polysilicon gate 111 and a dielectric 112 of a semiconductor device on an integrated circuit chip (not shown). The first channel 102 is damascened into the first channel oxide layer 108 (not shown in FIG. 1B) and the second channel 104 is damascened into the second channel oxide layer 110. The first and second channels 102 and 104 are in horizontal planes separated vertically by a series of dielectric layers. First is an etch stop dielectric layer, or stop nitride layer 114, above the first channel 102. A via dielectric layer, or oxide layer 116, followed by a second etch stop dielectric layer, via nitride layer 118.

Also shown disposed around and a part of the first channel 102 are a first adhesion/barrier layer 120 and a first seed layer 122, and around and a part of the second channel 104 and the cylindrical via 106 is a second adhesion/barrier layer 124 and a second seed layer 126. The adhesion/barrier layers 120 and 124 include adhesion/barrier material combinations such as titanium/titanium nitride, tantalum/tantalum nitride, tungsten nitride, and pure tantalum for copper or copper alloy conductive materials. For copper or copper alloy conductive materials, the first and second seed layers 122 and 126 are generally of copper. Usually, the pure form of a metal provides a good adhesive bond to the barrier materials and to the metal alloy at the same time.

Figure 2:
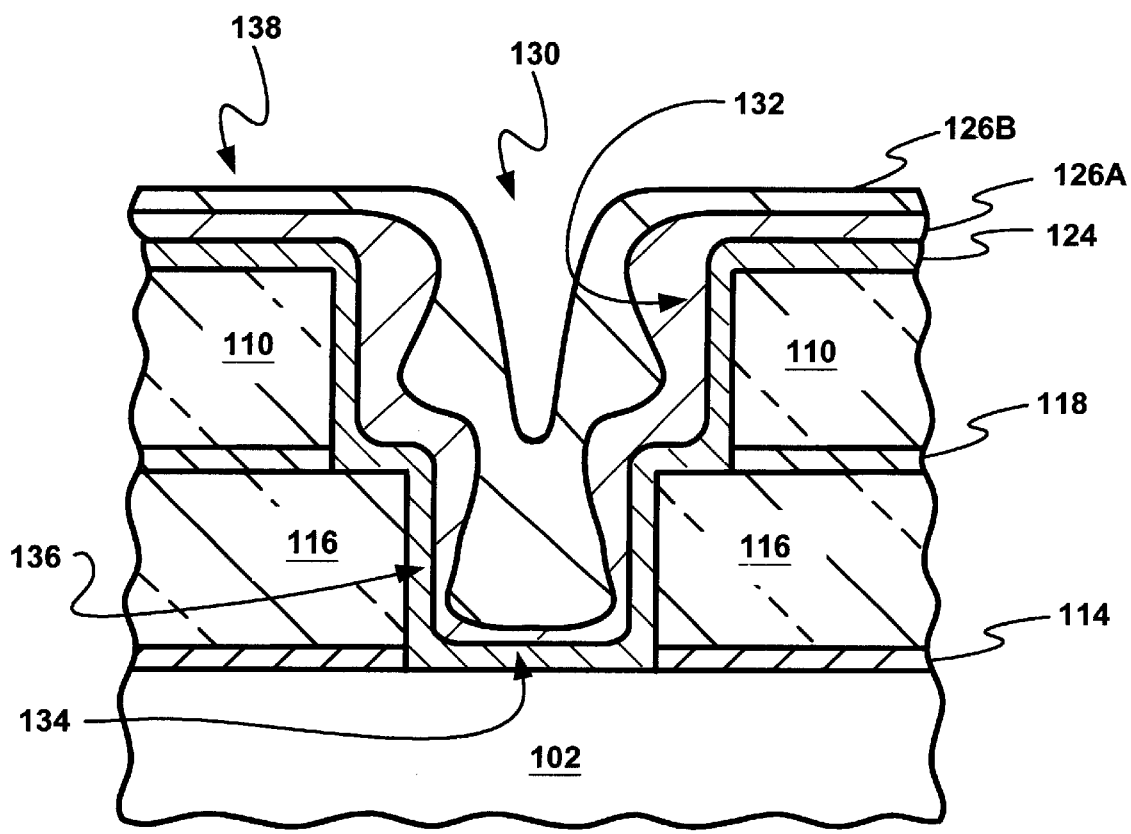
FIG. 2 is a close-up equivalent of the upper portion of FIG. 1B (PRIOR ART) which incorporates the present invention.

Referring now to FIG. 2, therein is shown a close-up of the second channel 104 and the via 106 prior. to final filling with conductive material. The first seed layer 122 (not shown in FIG. 2) could be an initially deposited seed layer and a secondarily deposited seed layer as part of the present invention. In the preferred mode of the present invention, the second seed layer 126 (shown in FIG. 2) is shown as an initially deposited seed layer 126A lined by a secondarily deposited layer 126B. Also shown for the second channel 104 is an open area, the re-entrant 130, at the top sidewall 132 of the second channel 104. A bottom 134 designates the contact area of the via 106 with the first channel 102 and a bottom sidewall 136 designates the lower portion of the via 106. The top area is designated as the top surface 138.

Figure 3:
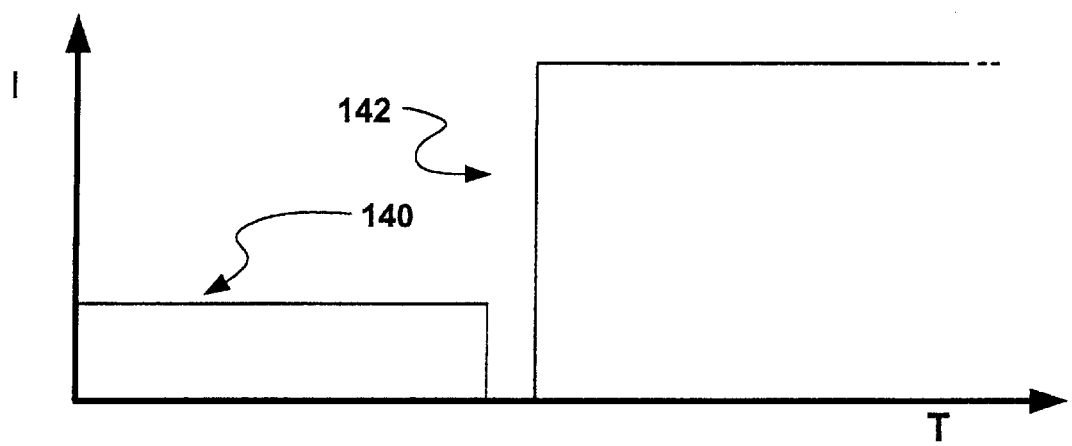
FIG. 3 is a chart of a very low direct current applied in the present invention.

Referring now to FIG. 3, therein is shown a chart of a very low direct current 140 for electroplating the seed layers 122 and 126B. Initially, the direct current 140 is started at the very low current density to thicken thin areas of the seed layer 126 as will be later explained. Secondarily, the current is increased to a moderate level as indicated by direct current 142. Subsequently, electrochemical deposition (ECD) is performed using a much higher current density 142 for depositing the filling conductive material.

Figure 4:
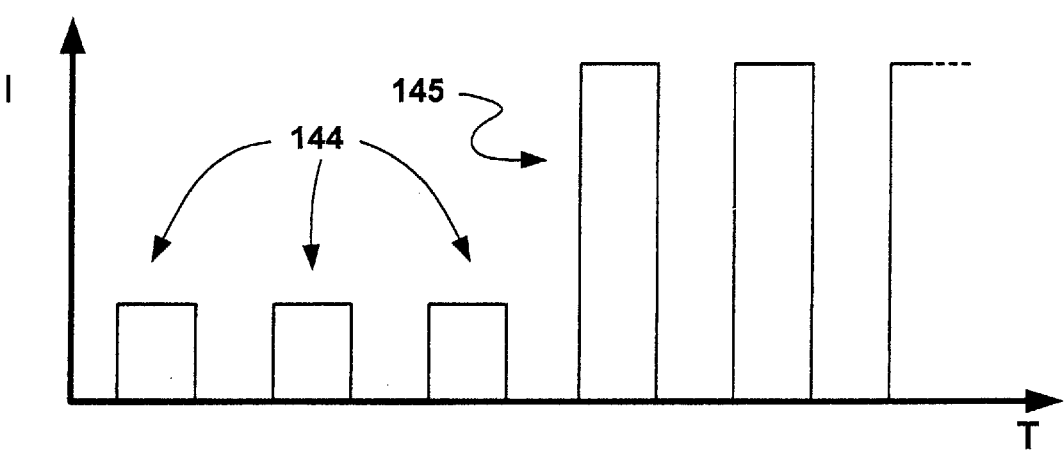
FIG. 4 is a chart of a forward pulse current applied in the present invention.

Referring now to FIG. 4, therein is shown a chart of a very low forward pulse current 144 for electroplating the seed layer 126. Initially, the very low forward pulse current 144 is started at the very low current density to thicken thin areas of the seed layer 126 as will be later explained. Secondarily, the very low current is increased to a moderate level as indicated by forward pulse current 145. While it is understood that the pulse current applies a large number of pulses, three forward pulses 144 and 145 are shown to demonstrate the forward pulse current being applied. The forward pulse current approach allows for better circulation of conductive material ions to the seed layer during electro-deposition. Subsequently, ECD is performed using a much higher current density 142 for depositing the filling conductive material. The higher current density could also be applied as a forward pulse current 145.

Figure 5:
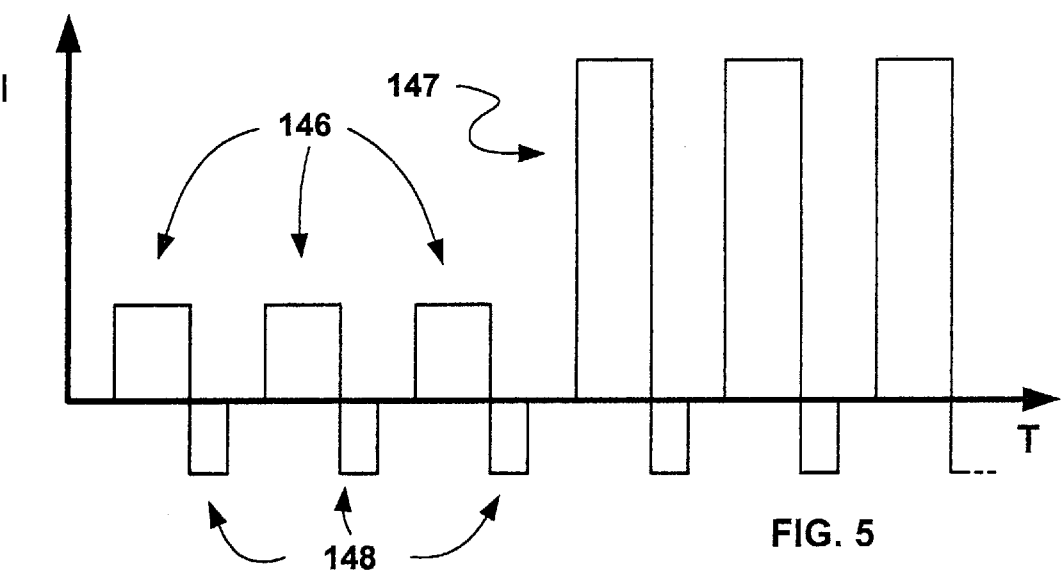
FIG. 5 is a chart of a reverse pulse current applied in the present invention.

Referring now to FIG. 5, therein is shown a chart of a very low forward pulse current 146 interspaced with reverse pulse current 148 for electroplating the seed layer 126. Initially, the very low bi-directional current pulses started at the very low current density to thicken thin areas of the seed layer 126 as will be later explained. Secondarily, the current is increased to a moderate level as indicated by forward pulse current 146. As would be understood in the process, there are many forward and reverse pulses 146 and 148, respectively, but three are shown for convenience. This process circulates the conductive material ions to provide more even, lower stress plating. Subsequently, ECD is performed using a much higher current density 142 for depositing the filling conductive material. The higher current density could also be applied as bi-directional current pulses 147.

In production, a conventional first damascene process is used to dispose the first channel 102 in the first channel oxide layer 108 above portions of the semiconductor device on a production semiconductor wafer 100. The damascene process is a photolithographic process which uses a mask to define a first channel opening in the first channel oxide layer 108. The first channel opening is then coated with the first adhesion/barrier layer 120 by any of a number of different processes such a chemical vapor deposition (CVD) or physical vapor deposition (PVD).

The first seed layer 122 is deposited on the adhesion/barrier layer 120 in the first channel opening, and its thickness is insufficient to fill opening in the first channel oxide layer 108. The first seed layer 122 is deposited using a conventional metal deposition technique such as sputtering, ion metal plasma (IMP) or hollow cathode metalization (HCM). In these processes, the metal ions are charged and directed toward the oppositely charged silicon wafer 100 to be deposited.

After the first seed layer 122 is deposited, the wafer 100 is transferred to an ECD plating bath containing a solution with a high concentration of conductive material ions. For copper interconnects, the conductive material ions would be of copper or copper alloys.

In the plating bath, the first seed layer 122 may be deposited with the application of the very low density current followed by the low density current before being filled by the high density current as shown in FIGS. 3, 4, and 5 as will be subsequently described in greater detail for the present invention. It will be understood by those skilled in the art that the very low density current is not currently necessary but as the feature size continues to shrink, the high density current will become optional and may be dispensed with when the feature size can be filled within a reasonable period of time by the very low density current followed by the low density current.

In the present invention, after the first seed layer 122 is fully deposited, the conductive material is deposited by the high density ECD current 142 to fill the first channel 102 at a deposition rate of 60 to 100 angstroms per second.

When the first channel 102 is filled, the conductive material, the first seed layer 122, and the first adhesion/barrier layer 120 are chemical-mechanical polished down to the first channel oxide layer 108. This results in the formation of the first channel 102 with the conductive material damascened into the first channel oxide layer 108.

The stop nitride layer 114, the via oxide layer 116, the via nitride layer 118, and the second channel oxide layer 110 would then be successively deposited on top of the first channel 102 and the first channel oxide layer 108 using conventional dielectric deposition techniques.

By using the via photoresist and the via photolithographic process followed by etching of a cylindrical hole in the second channel oxide layer 110 and the via nitride layer 118, the basis for the cylindrical via 106 is formed.

The second damascene process uses a further photolithographic process to define the opening for the second channel 104 in the second channel oxide layer 110. Since the second damascene process uses an anisotropic oxide etch for the second channel 104, the etch also forms the cylindrical via 106 down to the stop nitride layer 114. The anisotropic oxide etch etches faster in the vertical direction of FIG. 1B (PRIOR ART) than in the horizontal direction. The nitride etch of the stop nitride layer 114 exposes a portion of the first channel 102 and completes the etching steps.

Due to the high aspect ratio of the second channel 104 and the via 106 where the width of the channel 104 is much smaller than the depth of the second channel 104 and the via 106, the present invention is most critical in this region. Those skilled in the art would recognize that the present invention is applicable to the first channel 102 but is less critical at current semiconductor geometries.

The second adhesion/barrier layer 124 is first deposited by a vapor deposition process as a thin layer which is insufficient to fill the opening for the second channel 104 and the cylindrical via 106.

The initially deposited seed layer 126A is deposited on the adhesion/barrier layer 124 by a non-ECD metal deposition technique on the top surface 138 and in the opening of the second channel 104 and the cylindrical via 106. In the region where the second channel 104 and the cylindrical via 106 meet, the aspect ratio is the highest, and the deposition process generally tends to place the conductive material of the initially deposited seed layer 126A the thickest on the horizontal surfaces and the thinnest on the vertical surfaces. Typically, the thickest coverage occurs at the re-entrant 130 and thins down towards the bottom 134.

When the wafer 100 is placed in the ECD plating bath and an electrode is placed in contact with it, the initially deposited seed layer 126A acts as one electrode for the conductive material ions to plate on to. Due to the high aspect ratios which result in minimal seed coverage, the thickness of the initially deposited seed layer 126A varies at different areas. If a moderate to high plating rate process is employed to fill such a feature, the thicker coverage at the top sidewall 132 of this feature will have a much faster deposition/plating rate. The bottom 134 and bottom sidewall 136 will have a much slower deposition or plating rate. This disparity in plating rate is a result of three factors. First, the electric field at the re-entrant 130 and top sidewall 132 is stronger because of the corner edge and results in faster deposition which may result in the re-entrant 130 closing before the via 106 is fully plated. Second, the greater abundance of ion in the plating solution at the re-entrant 130 before it is depleted by deposition on the sidewalls 132 and 136 results in faster buildup and possibly closing with voids being formed. Third, thinner or insufficient conductive material at the bottom 134 and bottom sidewall 136 will develop a higher electrical resistance whereas the thicker conductive material at the top of the feature has a much lower electrical resistance which will accelerate the deposition rate and again cause closing with voids being formed.

If one plating waveform is used to fill the entire feature, the top surface 138, the re-entrant 130, and the top sidewall 132 will grow a thicker seed layer 126B compared to the bottom sidewall 136 and bottom 134. This is partially caused by the higher electrical resistance at the bottom sidewall 136 and bottom 134 because they have the thinnest seed coverage. Other reasons for this plating rate difference is controlled by diffusion in the re-entrant 130 and the top surface 138 where the copper ions are abundant compared to the bottom sidewall 136 and bottom 134. In addition to the above mechanism, the re-entrant 130 has the strongest electric field because of the corners of the feature.

In the present invention, there are organic additives added to the plating solution. For copper interconnects, the organic additives are available from a number of different sources. Typical of these organic additives are such chemicals as Cubath MD and Cubath MLo available from Enthone-OMI Inc. having a place of business at 1112 Ocean Avenue Suite 202, Manhattan Beach, Calif. 90266, or Microfab 2000 available from EEJA (Electroplating Engineers of Japan Ltd.), 14th FL., Yokohama ST Bldg., 1-11-15, Kitasaiwai, Nishi-ku, Yokohama 220 Japan. Although the exact concentration is determined heuristically, the organic additives are in a concentration of about one percent (1%).

The use of the organic additive will reduce the plating amount at the re-entrant 130 and top surface 138 because its concentration is higher in these two regions compared to bottom sidewall 136 and bottom 134. This will reduce plating speed. In order to fill a feature completely, a careful balance of the plating rates in the five positions is determined heuristically. The optimum condition is to enhance the plating rates in the bottom sidewall 136 and bottom 134 while keeping the re-entrant 130 still open. This step is achieved by using an initial step that provides only a few hundred angstroms of plating thickness to form the secondarily deposited layer 126B. Then the deposition rates are balanced at top sidewall 132, bottom sidewall 136, and bottom 134 such that enough seed material builds up when sidewall 136 meets the bottom 134.

The secondarily deposited layer 126B is first deposited at a very low deposition rate of about 1 to 15 angstroms per second of direct current to the initially deposited seed layer 126A, as shown in FIG. 3. After the first few hundred angstroms of plating, the deposition rate is then increased to a low deposition rate of 30 to 40 angstroms per second. This continues until the sidewall 136 meets the bottom 134. In an alternate mode, the secondarily deposited layer 126B is deposited at about 1 to 15 angstroms per second of pulsed current to the initially deposited seed layer 126A, as shown in FIG. 4. The forward pulse current approach allows for better circulation of conductive material ions to the seed layer 126 during electro-deposition since there is a pause between deposition cycles. Again, after the first few hundred angstroms of plating, the deposition rate is then increased to a low deposition rate of 30 to 40 angstroms per second. This continues until the sidewall 136 meets the bottom 134.

In a further alternate mode, the secondarily deposited layer 126B is deposited at about 1 to 15 angstroms per second of forward pulse current interspaced with 4 angstroms/second of reverse pulse current to the initially deposited seed layer 126A as shown in FIG. 4. The bi-directional pulse approach allows for even better circulation of conductive material ions because of the bi-directional motion of the ions in solution. Again, after the first few hundred angstroms of plating, the deposition rate is then increased to a low deposition rate of 30 to 40 angstroms per second. This continues until the sidewall 136 meets the bottom 134.

The filling of the seed layer 126 with conductive material to complete the first channel and second channels 102 and 104, and the via 106, is accomplished by the ECD process at a high current of 60 to 100 angstroms per seconds. In the past, relatively high plating currents were used to obtain acceptable filling of the deposited conductive material in the shortest process time.

As would be evident, the present invention encompasses all the various combinations of low plating current followed by high plating current for direct, forward pulse, and bi-directional pulse currents.

While the best mode utilizes copper as the conductive material, it should be understood that the present invention is applicable to other conductive and electroplating materials such as aluminum, copper, gold, silver, an alloy thereof, and a combination thereof.

Further, although the embodiments of the present invention are directed to using single and dual damascene techniques, it also will be recognized by those skilled in the art that other techniques of forming interconnects or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel, it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method of manufacturing a semiconductor device, comprising the steps of:
   providing a semiconductor with a dielectric layer formed thereon, wherein said dielectric layer overlays a region on said semiconductor;
   forming an opening in said dielectric layer, said opening defined by sidewalls of said dielectric layer and a bottom exposing a portion of said region on said semiconductor;
   depositing an initially deposited copper seed layer by a non-electrochemical deposition process over said dielectric layer and in said opening, including along said walls, said initially deposited copper seed layer formed to a thickness insufficient to fill said opening; depositing a secondarily deposited copper seed layer by an electrochemical deposition process over said initially deposited copper seed layer, said depositing performed initially at a very low rate and increased to a low rate, wherein plating at the very low deposition rate is continued until under a few hundred angstroms of said copper seed layer have been deposited and plating at the low rate is continued until the copper deposited on the sidewalls of said opening meets copper deposited on the bottom; and depositing copper material in contact with said secondarily deposited seed layer by a third process to substantially fill said opening.

2. The method as claimed in claim 1 wherein depositing said secondarily deposited seed layer is performed in an electrochemical deposition process using an organic additive and very low and low depositions to control deposition in selected regions of said opening.

3. The method as claimed in claim 1 wherein depositing said secondarily deposited copper seed layer is performed using a very low deposition rate of about two to fifteen angstroms per second followed by a low deposition rate of about thirty to forty angstroms per second.

4. The method as claimed in claim 1 wherein depositing said secondarily deposited copper seed layer is performed using a very low deposition rate of about two to fifteen angstroms per second followed by a low deposition rate of about thirty to forty angstroms per second and wherein the very low deposition rate deposits about two to three hundred angstroms of said copper seed layer.

5. The method as claimed in claim 1 wherein depositing said secondarily deposited copper seed layer is performed using a very low direct current to deposit at two to fifteen angstroms per second followed by a low direct current to deposit at thirty to forty angstroms per second.

6. The method as claimed in claim 1 wherein depositing said secondarily deposited copper seed layer is performed using a very low forward pulse current to deposit at two to fifteen angstroms per second followed by a low forward pulse current to deposit at thirty to forty angstroms per second.

7. The method as claimed in claim 1 wherein depositing said secondarily deposited seed layer is performed using a very low bi-directional pulse current of forward and reverse pulses to deposit at two to fifteen angstroms per second followed by a low bi-directional current of forward and reverse pulses to deposit at thirty to forty angstroms per second.

8. The method as claimed in claim 1 wherein depositing said secondarily deposited seed layer and said coppen material are performed at a very low deposition rate of about two to fifteen angstroms per second, a low deposition rate of about thirty to forty angstroms per second, and a high deposition rate of sixty to one hundred angstroms per second.

9. The method as claimed in claim 1 including depositing an adhesive/barrier layer over said dielectric layer and in said opening, including along said walls, said adhesive/barrier layer formed to a thickness insufficient to fill said opening; said adhesive/barrier layer deposited before depositing said initially deposited seed layer.

* * * * *